US012283467B2

(12) United States Patent
Long et al.

(10) Patent No.: US 12,283,467 B2
(45) Date of Patent: Apr. 22, 2025

(54) PLASMA STRIP TOOL WITH MOVABLE INSERT

(71) Applicants: Beijing E-Town Semiconductor Technology Co., Ltd., Beijing (CN); Mattson Technology, Inc., Fremont, CA (US)

(72) Inventors: Maolin Long, Santa Clara, CA (US); Qiqun Zhang, Palo Alto, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 620 days.

(21) Appl. No.: 17/458,807

(22) Filed: Aug. 27, 2021

(65) Prior Publication Data

US 2022/0068611 A1    Mar. 3, 2022

Related U.S. Application Data

(60) Provisional application No. 63/071,418, filed on Aug. 28, 2020.

(51) Int. Cl.
*H01J 37/32*    (2006.01)
*B08B 7/00*     (2006.01)
*H01L 21/263*   (2006.01)

(52) U.S. Cl.
CPC ...... *H01J 37/32623* (2013.01); *B08B 7/0035* (2013.01); *H01J 37/321* (2013.01); *H01J 37/32422* (2013.01); *H01L 21/263* (2013.01); *H01J 2237/3342* (2013.01)

(58) Field of Classification Search
CPC ............... H01J 37/32623; H01J 37/321; H01J 37/32422; H01J 37/32357; H01J 37/3211; H01J 37/32431; H01J 2237/3342; B08B 7/0035; H01L 21/263
See application file for complete search history.

(56) References Cited

U.S. PATENT DOCUMENTS

| | | | |
|---|---|---|---|
| 6,770,165 B2 | 8/2004 | Obuchi | |
| 7,183,716 B2 | 2/2007 | Kanarov et al. | |
| 8,608,903 B2 * | 12/2013 | Yamazawa | H01J 37/321 118/723 AN |
| 9,171,734 B1 | 10/2015 | Toyoda et al. | |
| 9,214,319 B2 * | 12/2015 | Nagorny | H01J 37/3244 |
| 11,658,006 B2 | 5/2023 | Nargorny et al. | |
| 11,854,770 B2 | 12/2023 | Liu et al. | |
| 2003/0015293 A1 | 1/2003 | Obuchi | |

(Continued)

*Primary Examiner* — Dale E Page
*Assistant Examiner* — Quovaunda Jefferson
(74) *Attorney, Agent, or Firm* — Dority & Manning, P.A.

(57) ABSTRACT

Plasma processing apparatus for processing a workpiece are provided. In one example embodiment, a plasma processing apparatus for processing a workpiece includes a processing chamber, a plasma chamber separated from the processing, and an inductively coupled plasma source configured to generate a plasma in the plasma chamber. The apparatus includes a pedestal disposed within the processing chamber configured to support a workpiece. The apparatus includes an insert disposed in the plasma chamber movable to one or more vertical positions within the plasma chamber. Methods for processing of workpieces are also provided.

18 Claims, 7 Drawing Sheets

(56) References Cited

U.S. PATENT DOCUMENTS

| | | |
|---|---|---|
| 2003/0111963 A1 | 6/2003 | Tolmachev et al. |
| 2005/0093460 A1 | 5/2005 | Kim et al. |
| 2012/0006490 A1 | 1/2012 | Yamamoto et al. |
| 2013/0192759 A1 | 8/2013 | Setsuhara et al. |
| 2018/0358206 A1* | 12/2018 | Ma .................... B08B 5/00 |
| 2018/0358208 A1 | 12/2018 | Ma et al. |
| 2022/0223374 A1 | 7/2022 | Nagorny et al. |
| 2022/0223381 A1 | 7/2022 | Liu et al. |
| 2023/0369017 A1 | 11/2023 | Nargomy et al. |

* cited by examiner

PLASMA STRIP TOOL WITH MOVABLE INSERT

PRIORITY CLAIM

The present application claims the benefit of priority of U.S. Provisional Application Ser. No. 63/071,418, titled "PLASMA STRIP TOOL WITH MOVABLE INSERT," filed Aug. 28, 2020, which is incorporated herein by reference for all purposes.

FIELD

The present disclosure relates generally to apparatuses, systems, and methods for processing a substrate using a plasma source.

BACKGROUND

Plasma processing is widely used in the semiconductor industry for deposition, etching, resist removal, and related processing of semiconductor wafers and other substrates. Plasma sources (e.g., microwave, ECR, inductive, etc.) are often used for plasma processing to produce high density plasma and reactive species for processing substrates. Plasma strip tools can be used for strip processes, such as photoresist removal. Plasma strip tools can include a plasma chamber where plasma is generated and a separate processing chamber where the substrate is processed. The processing chamber can be "downstream" of the plasma chamber such that there is no direct exposure of the substrate to the plasma. A separation grid can be used to separate the processing chamber from the plasma chamber. The separation grid can be transparent to neutral species but not transparent to charged particles from the plasma. The separation grid can include a sheet of material with holes.

Uniformity control in plasma strip tools can be important for improved performance (e.g., improved ash rate performance). Uniformity can be difficult to tune in a plasma strip tool without manipulating process parameters, such gas pressure and flow, and RF power provided to induction coils used to generate the plasma.

BRIEF DESCRIPTION

Aspects and advantages of the disclosed technology will be set forth in part in the following description, or may be obvious from the description, or may be learned through practice of the disclosure.

One example aspect of the present disclosure is directed to a plasma processing apparatus. The plasma processing apparatus includes a processing chamber, a plasma chamber separated from the processing chamber, an inductively coupled plasma source configured to generate a plasma in the plasma chamber, and an insert disposed in the plasma chamber that is movable to one or more vertical positions within the plasma chamber.

Another example aspect of the present disclosure is directed to a method for processing a workpiece in a plasma processing apparatus. The plasma processing apparatus having a plasma chamber separated from a processing chamber. The plasma chamber having an insert disposed therein movable to one or more vertical positions within the plasma chamber. The processing chamber having a workpiece support. The method includes admitting a process gas to the plasma chamber; generating one or more species from the process gas using a plasma induced in a plasma chamber; moving the insert from a first vertical position to a second vertical position within the plasma chamber; filtering the one or more species to generate a filtered mixture; and exposing the workpiece to the filtered mixture to process the workpiece.

These and other features, aspects and advantages of the disclosed technology will become better understood with reference to the following description and appended claims. The accompanying drawings, which are incorporated in and constitute a part of this specification, illustrate embodiments of the disclosed technology and, together with the description, serve to explain the principles of the disclosed technology.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to uniformity control in plasma strip tools and plasma processing apparatuses. It is noted that the phrases "plasma strip tool" and "plasma processing apparatus," including their plural forms, are used interchangeably herein. Example embodiments of the present disclosure can be used to provide uniformity tunability in a plasma strip tool using features that can provide for radial tunability.

Radial tunability can refer to tunability in a radial direction extending between a center portion of a workpiece processed in the plasma strip tool to a peripheral portion of a substrate processed in the plasma strip tool. According to example aspects of the present disclosure, radial tunability can be achieved, for instance, using an insert disposed in the plasma chamber that is moveable therein to one or more vertical positions.

Existing plasma processing apparatuses often require hardware changes in order to optimize radial uniformity. For example, other processing devices require grids to be swapped or changed in order to optimize radial tunability. Such hardware changes require that the vacuum of the chamber is broken in order to replace hardware components, which is undesirable. Additionally, it is difficult to adjust radical uniformity during processing of the workpieces.

Thus, according to an example embodiment, a plasma processing apparatus for processing a workpiece is provided. The plasma processing apparatus includes a processing chamber, a plasma chamber separated from the processing chamber, and an inductively coupled plasma source configured to generate a plasma in the plasma chamber. A separation grid can be used to separate the plasma chamber from the processing chamber. The plasma processing apparatus can further include a pedestal disposed within the processing chamber, the pedestal configured to support a workpiece. Furthermore, the plasma processing apparatus includes an insert disposed in the plasma chamber that is movable to one or more vertical positions within the plasma chamber. In embodiments, the insert can be moved to one or more vertical positions in the processing chamber during process of the workpiece to improve radial tunability, uniformity, efficiency, or ash rate.

Aspects of the present disclosure provide a number of technical effects and benefits. For instance, the plasma processing apparatus including the insert can be used to control uniformity and efficiency during processing of workpieces. The insert can be moved up and down vertically in the processing chamber creating a distance between the lower closed end of the insert and a top surface of the upper grid. Thus, the length of diffusion path in plasma transportation from the heating zone to the separation grids can be actively controlled. This enables the ability to tune the plasma uniformity profile from center to edge. Adjusting plasma diffusion to the center area by changing the vertical position of the tubular insert is advantageous over adjusting the opening percentage of grids between center area and edge area, which is fixed during workpiece processing.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within 10% of the stated numerical value. The use of the term "pedestal" can refer to any structure operable to support a workpiece during processing.

Figure 1:
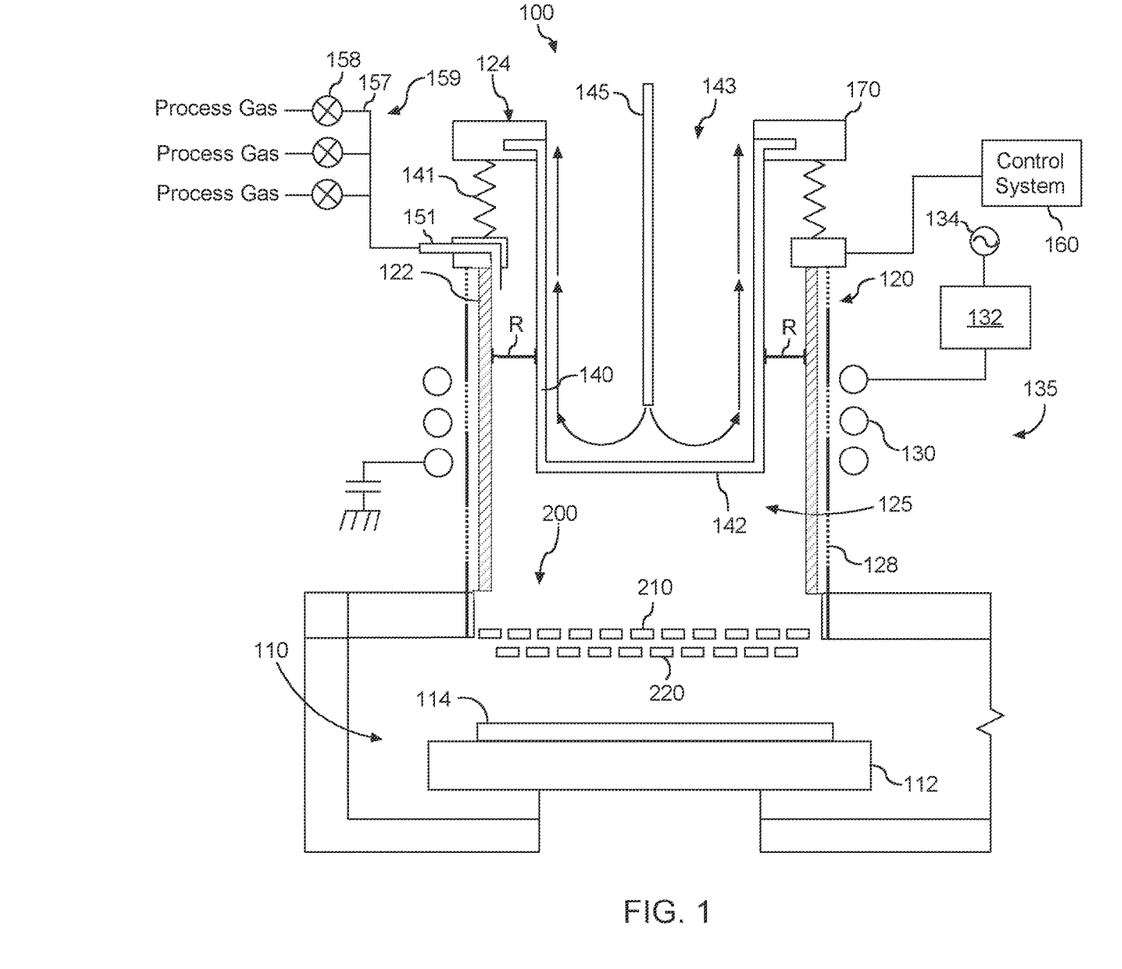
FIG. 1 depicts an example plasma processing apparatus according to example embodiments of the present disclosure.

FIG. 1 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. The induction coil 130 can be formed of any suitable material, including conductive materials suitable for inducing plasma within the plasma chamber 120. Process gases can be provided to the chamber interior 125 from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma. The grounded Faraday shield 128 can be formed of any suitable material or conductor, including materials similar or substantially similar to the induction coil 130.

As shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

An insert 140 is disposed in the chamber interior 125. The insert 140 can be moved to one or more vertical positions within the chamber interior 125. The insert 140 is concentrically disposed with the side wall 122 of the plasma chamber 120. The insert 140 can be a tubular insert or can be any other suitable shape. The insert 140 has a closed end 142 and an open end 143. The closed end 142 can be of any suitable shape. For example, the closed end 142 can have a half sphere shape, a flat bottom, a conical shape, or a tapered shape. In embodiments, the insert 140 can include a stepped shape. The open end 143 is open to the ambient atmosphere. For instance, the open end 143 is open to atmosphere. The insert 140 is disposed within the plasma chamber 120 such that a vacuum in the plasma chamber can be maintained in the chamber interior 125 while the insert 140 is moved between different vertical positions in the plasma chamber 120. For example, in embodiments, the insert 140 can be disposed in the plasma chamber 120 and one or more ring seals can be utilized on, around or about the insert 140 in order to create a vacuum sealed plasma chamber 120.

Figure 2:
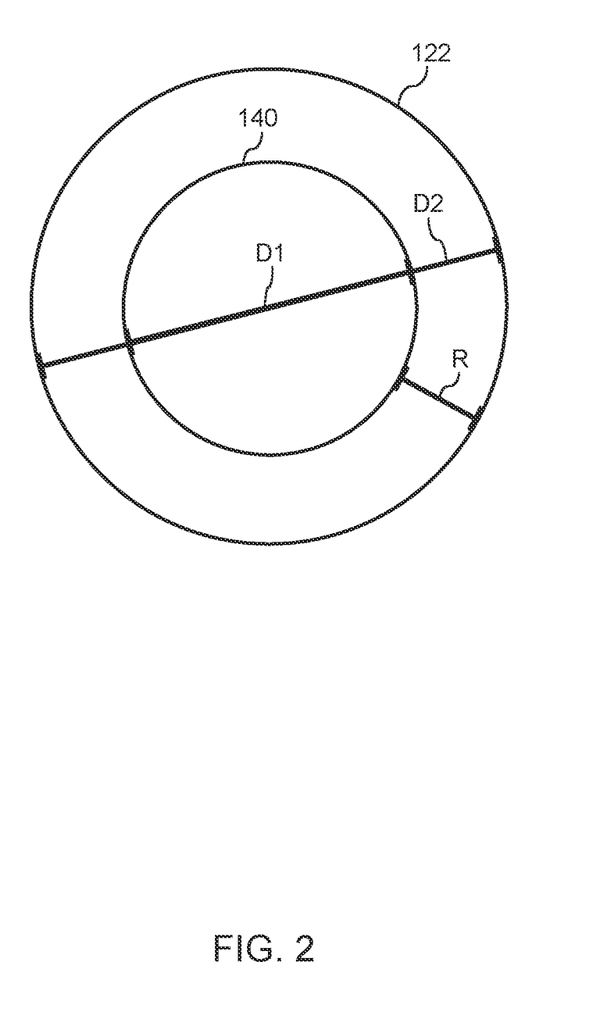
FIG. 2 depicts a top down view of a plasma processing apparatus according to example embodiments of the present disclosure.

As shown in FIG. 2, the insert 140 has a diameter D1 and the side wall 122 of the plasma chamber 120 has a diameter D2. The diameter D1 of the insert 140 is less than the diameter D2 of the plasma chamber. Accordingly, vacuum space with a radial thickness R is defined between the outer surface of the insert 140 and the inner wall of the plasma chamber 120. For example, a vacuum space with a radial thickness R is defined between the outer surface of the insert 140 and the inner surface of the side wall 122 of the plasma chamber 120. The radical thickness R is the difference between diameter D2 and diameter D1. According to one embodiment, the radial thickness R is from about 5 mm to about 150 mm. The region defined by the radial thickness R can provide an active region confined within the plasma chamber between the insert 140 and the side wall 122 for active heating of electrons. For example, process gas can be fed into the chamber interior 125 proximate to the induction coil 130 in the region defined between the insert 140 and the side wall 122.

Figure 3:
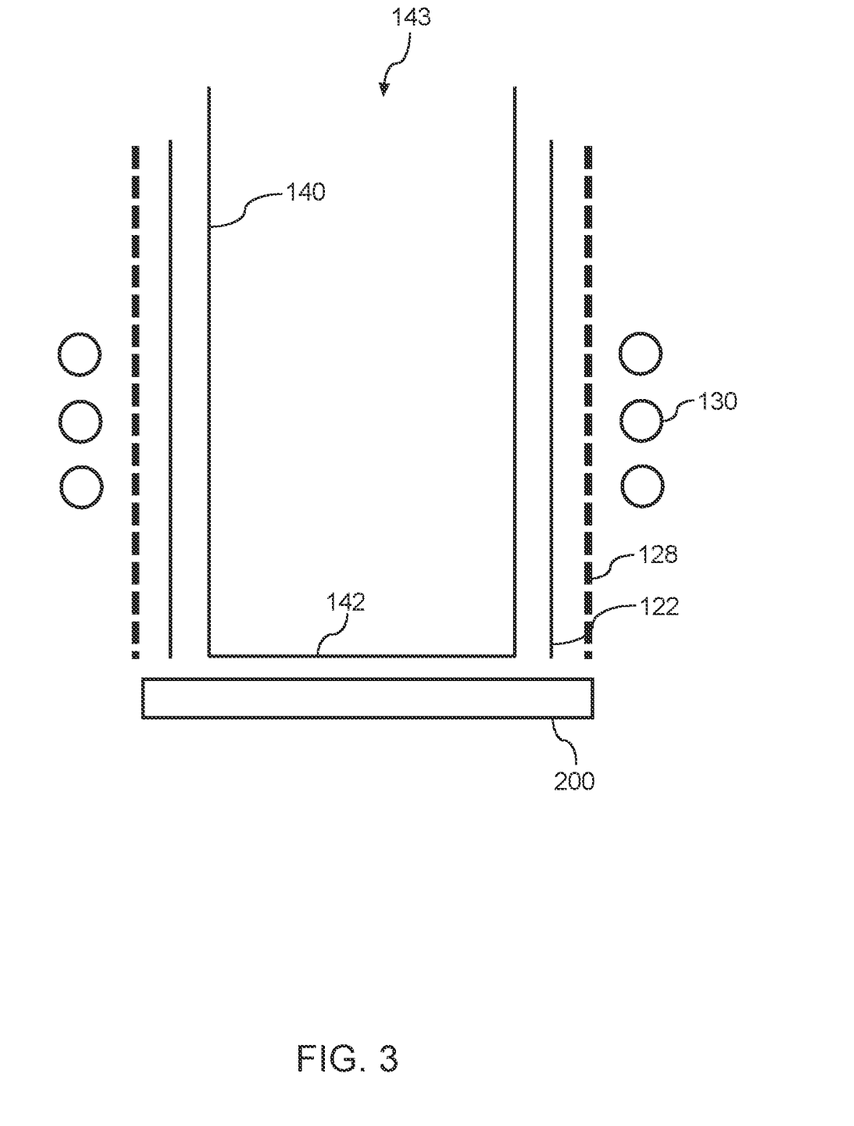
FIG. 3 depicts a portion of an example plasma processing apparatus according to example embodiments of the present disclosure.
Figure 4:
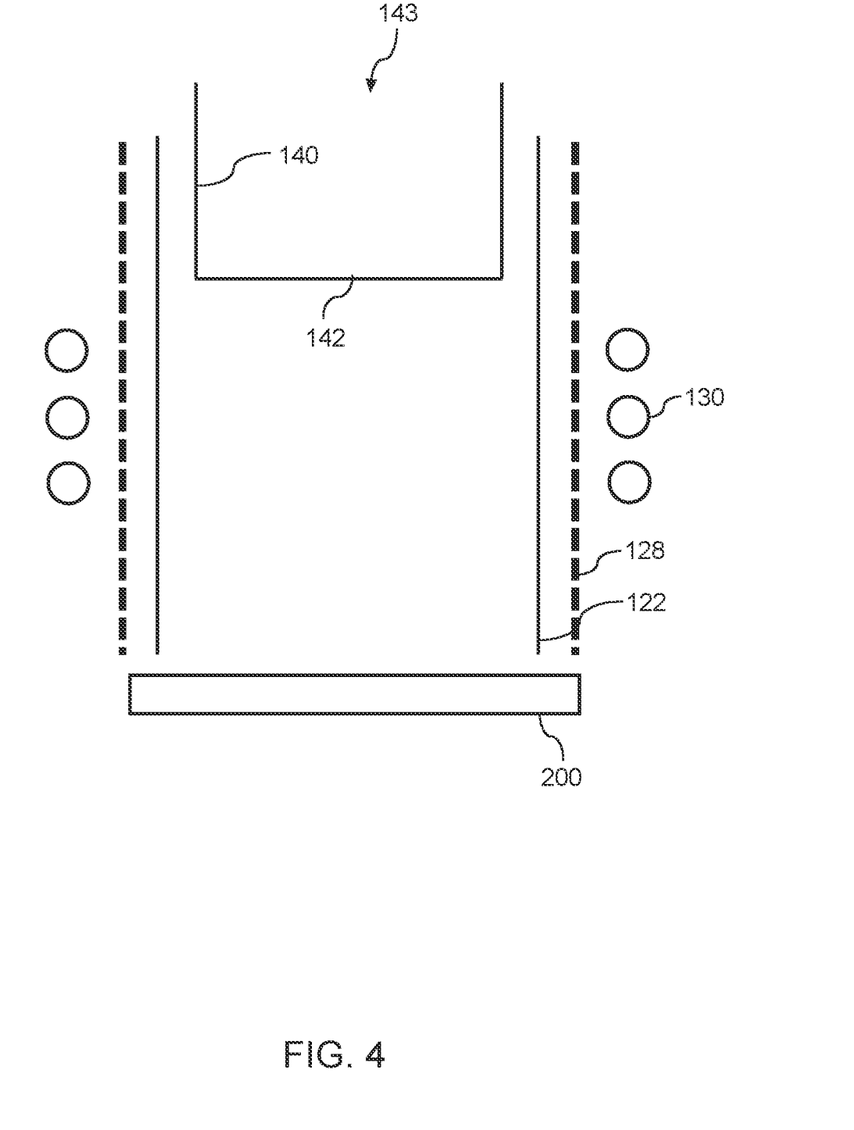
FIG. 4 depicts a portion of an example plasma processing apparatus according to example embodiments of the present disclosure.

The insert 140 can be configured to one or more lifting devices, such as bellows 141, capable of moving the insert 140 up and down in a vertical manner within the chamber interior 125. While bellows 141 are shown, the disclosure is not so limited. Indeed, any number of suitable lifting devices capable of moving the insert 140 up and down in a vertical manner in the chamber interior 125 may be used herein. For example, as shown in FIG. 3, in embodiments the closed end 142 of the insert 140 can be moved to a vertical position as low as about 1 mm from the top surface of the separation grid 200. In other embodiments, however, the closed end 142 of the insert 140 can be in a vertical position as high as about 100 mm above the top end of the inductively coupled plasma source, such as high as about 100 mm above the top coil of the induction coil 130, as shown in FIG. 4. Any desired vertical position between the two described herein can be achieved depending on desired process parameters.

The insert 140 can include a gas injection insert 145 disposed in the center of the insert for delivering forced air or gas towards the interior closed end 142 of the insert 140. For example, the gas injection insert can include a tube, such as a Teflon® tube capable of providing cooled air or gas to the interior of the insert 140. Air or gas provided by the gas injection insert 145 cools the closed end 142 of the insert 140 and travel up towards the open end 143 according to the arrows shown thereby passing along the interior surfaces of the insert 140, thus cooling the insert 140.

In embodiments, the insert 140 can be communicatively coupled to a control system 160 that can be used to control the vertical position of the insert 140. For example, the control system 160 can be communicatively coupled to the bellows 141 to raise or lower the insert 140 according to process parameters. The control system 160 is configured to perform operations. The operations can include adjusting process parameters according to input instructions. For example, the operations can include adjusting the vertical position of the insert 140. Accordingly, one or more control parameters can be input to the control system, such that processing conditions, including vertical placement of the insert 140, can be controlled during workpiece processing. The control system 160 can be an automated, computer-based control system. The automated, computer-based control system can include one or more processors and one or more memory devices. The one or more processors can execute computer-readable instructions stored in the one or more processors to cause the one or more processors to perform operations. For instance, the one or more processors can provide control signals to various components (e.g., the insert 140, the holding device 170, lifting devices, e.g. bellows 141, etc.) to control operation of a plasma processing apparatus. Specifically, the one or more processor can provide control signals to components of the plasma processing apparatus 100 to move the insert 140 to different vertical positions in the interior chamber 125.

The insert 140 can be held in contact with the bellows 141 one or more holding devices 170. For example, the holding device 170 can include an annular ring having a recess therein capable of engaging an annular flange about the top of the insert 140. The holding device 170 can be formed from any suitable material, include metal. In embodiments, where the insert 140 is formed from a quartz or ceramic material and the holding device 170 is formed from metal, one or more shims or inserts can be disposed between the insert 140 and the holding device 170. The one or more shims can be formed form a material to prevent rubbing and friction between the insert 140 and the holding device 170. For instance, the shim can be formed from polytetrafluoroethylene, such as Teflon®. The one or more shims can be formed from any other elastomeric material capable of reducing friction between the quartz or ceramic surface of the insert 140 and the surrounding metal surfaces of the holding device 170.

The holding device 170 can include an O-ring capable of clamping an annular ring of the insert 140 to secure the insert 140 in the plasma chamber 120. In such embodiments, the insert 140 is secured to the holding device 170 such that a vacuum can be provided in the interior chamber 125. Accordingly, in embodiments, the holding device 170 can form a portion of the ceiling 124. The chamber interior 125 can be formed from the dielectric side wall 122, the holding device 170, and the insert 140. One or more vacuum seals can be formed between the holding device 170 and the insert 140, such that vacuum conditions can be maintained in the interior chamber 125.

As shown in FIG. 1, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves 158 and/or mass flow controllers to deliver a desired amount of gases into the plasma chamber as process gas. The gas delivery system 150 can be used for the delivery of any suitable process gas. Example process gases include, oxygen-containing gases (e.g. $O_2$, $O_3$, $N_2O$, $H_2O$), hydrogen-containing gases (e.g., $H_2$, $CH_4$, $NH_3$), nitrogen-containing gas (e.g. $N_2$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), deuterium ($D_2$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. The plasma processing apparatus 150 of FIG. 1 can implement a process such as a strip or etch process using remote plasma.

Figure 5:
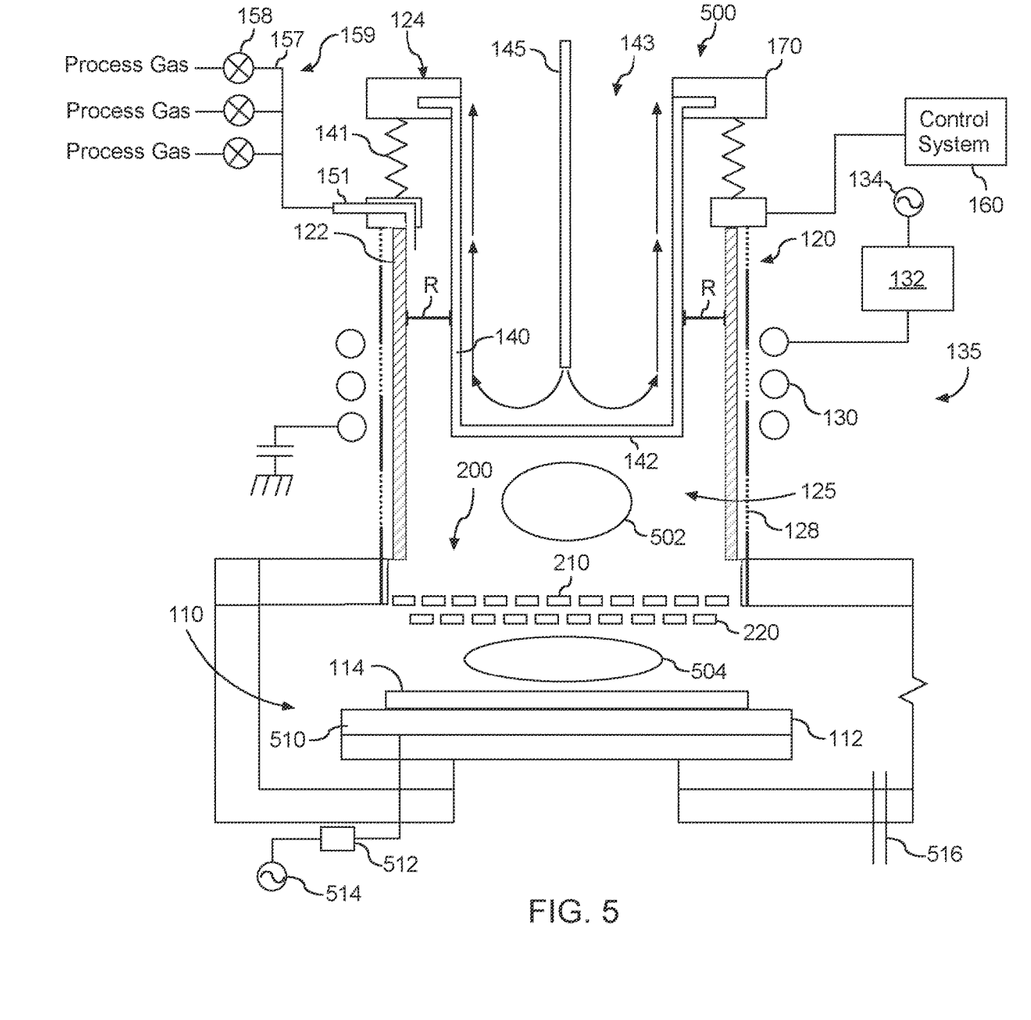
FIG. 5 depicts an example plasma processing apparatus according to example embodiments of the present disclosure.

FIG. 5 depicts an example plasma processing apparatus 500 that can be used to implement processes according to example embodiments of the present disclosure. The plasma processing apparatus 500 is similar to the plasma processing apparatus 100 of FIG. 1.

More particularly, plasma processing apparatus 500 includes a processing chamber 110 and a plasma chamber 120 that is separated from the processing chamber 110. Processing chamber 110 includes a workpiece holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 5, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 5 is operable to generate a first plasma 502 (e.g., a remote plasma) in the plasma chamber 120 and a second plasma 504 (e.g., a direct plasma) in the processing chamber 110.

More particularly, the plasma processing apparatus 500 of FIG. 5 includes a bias source having a bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The radicals or species used in the breakthrough process or etch process according to example aspects of the present disclosure can be generated using the first plasma 502 and/or the second plasma 504.

Figure 6:
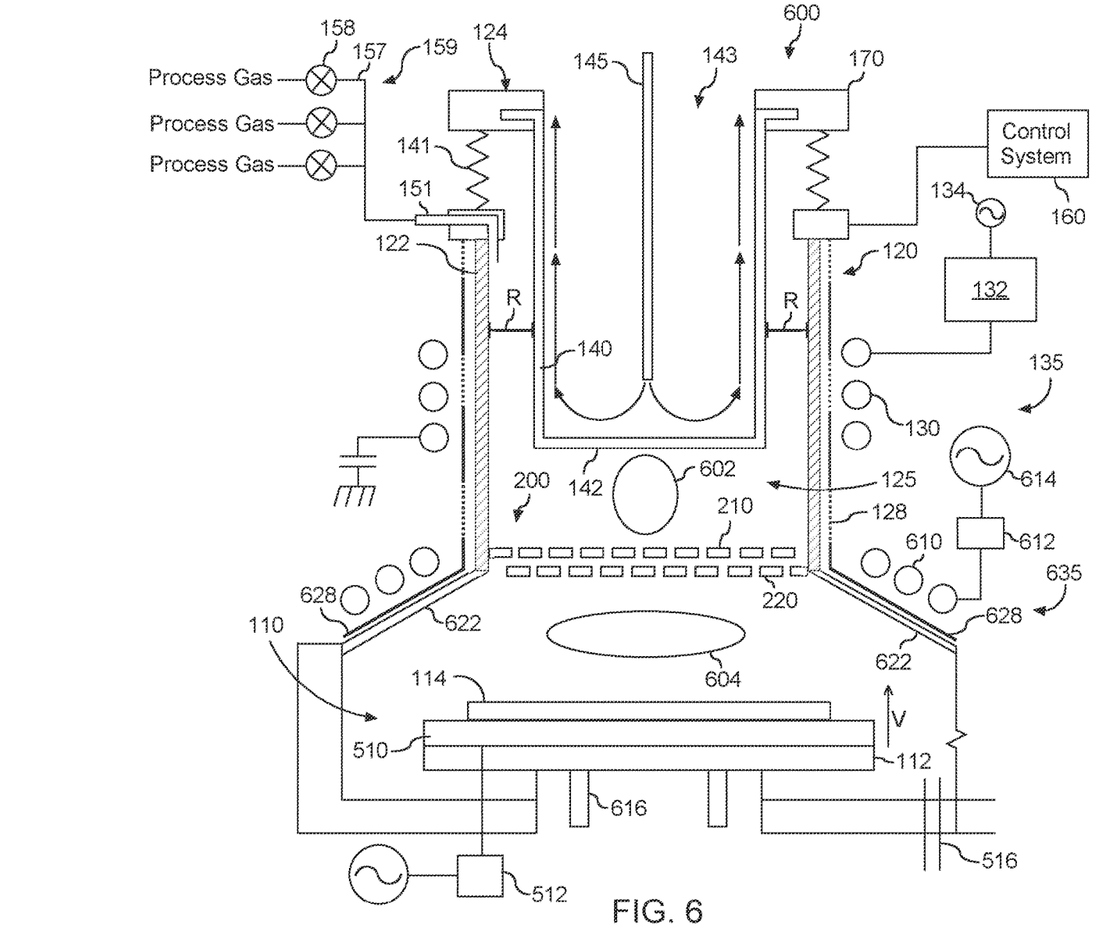
FIG. 6 depicts an example plasma processing apparatus according to example embodiments of the present disclosure.

FIG. 6 depicts a processing chamber 600 similar to that of FIG. 1 and FIG. 5. More particularly, plasma processing apparatus 600 includes a processing chamber 110 and a plasma chamber 120 that is separated from the processing chamber 110. Processing chamber 110 includes a workpiece holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 6, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 6 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The pedestal 112 can be movable in a vertical direction V. For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

The plasma processing apparatus 600 of FIG. 6 includes a bias source having bias electrode 510 in the pedestal 112. The bias electrode 510 can be coupled to an RF power generator 514 via a suitable matching network 512. The processing chamber 110 can include a gas exhaust port 516 for evacuating a gas from the processing chamber 110. The hydrogen radicals used in the photoresist etch processes according to example aspects of the present disclosure can be generated using the first plasma 602 and/or the second plasma 604.

As described above, several example embodiments of plasma processing apparatus have been described in detail. The plasma processing apparatuses include an insert moveable to one or more vertical locations within the plasma chamber. Movement of the insert to different vertical positions can be used to affect various process parameters. For example, the insert can be moved to a vertical position to adjust process uniformity during workpiece processing. The insert can be moved to a vertical position to adjust efficiency during workpiece processing. The insert can be moved to a vertical position to increase ash rate during workpiece process. Advantageously, the insert can be adjusted to various vertical positions during processing in according to desired processing conditions.

Figure 7:
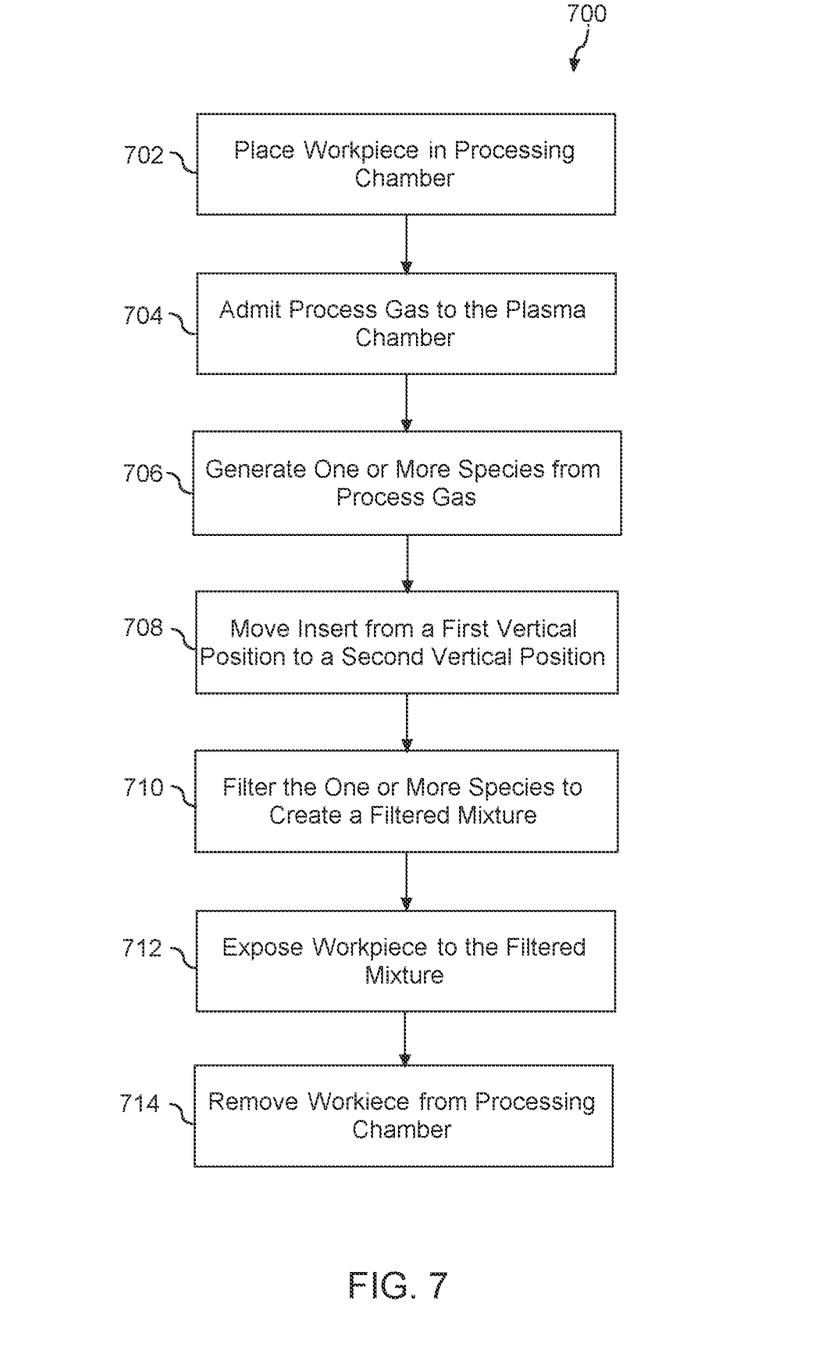
FIG. 7 depicts an example flowchart of a method for processing a workpiece according to example embodiments of the present disclosure.

FIG. 7 depicts a flow diagram of one example method (700) according to example aspects of the present disclosure. The method (700) will be discussed with reference to the plasma processing apparatus 100 of FIG. 1 by way of example. The method (700) can be implemented in any suitable plasma processing apparatus. FIG. 7 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece 114 in a processing chamber 110 of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110 of FIG. 1. The workpiece 114 can include one or more layers comprising silicon, silicon dioxide, silicon carbide, one or more metals, one or more dielectric materials, or combinations thereof. In embodiments, the workpiece includes at least one material layer needing to be removed or etched from the workpiece.

At (704) the method includes admitting a process gas to the plasma chamber. For example, a process gas can be admitted to the plasma chamber 120 via the gas delivery system 150 including a gas distribution channel 151. The gas delivery system 150 can be used to deliver a process gas capable of etching at least one material layer from the workpiece 114. For example, the process gas can include oxygen-containing gases (e.g. $O_2$, $O_3$, $N_2O$, $H_2O$), hydrogen-containing gases (e.g., $H_2$, $CH_4$, $NH_3$), nitrogen-containing gases (e.g. $N_2$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), deuterium ($D_2$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120.

At (706) the method includes generating one or more species from the process gas using a plasma induced in the plasma chamber 120. For example, to generate one or more species or radicals, the induction coil 130 can be energized with RF power from the RF power generator 134, to generate a plasma from the process gas in the plasma chamber 120. The plasma generated can include one or more species including radicals or etchant radicals. Etchant radicals are those that can be used to remove portions of material or material layers from the workpiece. Examples of etchant radicals include, hydrogen radicals, oxygen radicals, fluorine radicals, and combinations thereof. In some embodiments, the plasma generated in the plasma chamber is a remote plasma containing one or more radicals, such as hydrogen radicals, fluorine radicals, oxygen radicals, and combinations thereof.

At (708) the method includes moving the insert from a first vertical position to a second vertical position within the plasma chamber 120. For example, one or more lifting devices, such as bellows 141, can be used to move the insert 140 up and down in a vertical manner within the chamber interior 125. The insert 140 can be moved to a vertical position as low as about 1 mm from the top surface of the separation grid 200 or can be moved to a vertical position as high as about 100 mm above the top end of the inductively coupled plasma source. For instance, the insert 140 can be moved to a vertical position as high as about 100 mm above the top coil of the induction coil 130. The insert 140 can be moved from a first vertical position to a second vertical position that is different from the first. For instance, the insert 140 can be moved a higher vertical position or a lower vertical position. A control system 160 communicatively coupled to one or more lifting devices can be used to raise or lower the insert 140 according to control parameters input to the control system 160. Additionally, the insert 140 can be moved to multiple different positions during processing of the workpiece 114.

The insert 140 is concentrically disposed with the side wall 122 of the plasma chamber 120. The insert 140 can be a tubular insert or can be any other suitable shape. The insert 140 has a closed end 142 and an open end 143. The closed end 142 can be of any suitable shape. Accordingly, the closed end 142 can be moved to different vertical positions in the chamber interior 125 depending on input process parameters.

At (710) the method includes filtering the one or more species to generate a filtered mixture. To create a filtered mixture the one or more species can be filtered via a separation grid 200 that separates the plasma chamber 120 from the processing chamber to generate the desired radicals. The separation grid 200 can be used to perform ion filtering from a mixture generated by plasma in the plasma chamber 120 to generate a filtered mixture. The filtered mixture may contain one or more radicals.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

At (712) the method includes exposing the workpiece to the filtered mixture. The filtered mixture can include one or more etchant radicals capable of removing portions of material or material layers from the workpiece 114. For example, the filtered mixture can include one or more radicals capable of stripping material from the workpiece 114.

At (714) the method includes removing the workpiece from the processing chamber 110. For instance, the workpiece 114 can be removed from workpiece support 112 in the processing chamber 110. The plasma processing apparatus can then be conditioned for future processing of additional workpieces.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A plasma processing apparatus for processing a workpiece, the plasma processing apparatus comprising:
    a processing chamber;
    a plasma chamber separated from the processing chamber;
    an inductively coupled plasma source configured to generate a plasma in the plasma chamber;
    a pedestal disposed within the processing chamber, the pedestal configured to support a workpiece;
    an insert disposed in the plasma chamber, wherein the insert is a tubular insert having a first closed end and a second open end, the first closed end is disposed within the plasma chamber and the second open end is open to atmosphere, wherein the insert is configured to be movable to one or more vertical positions within the plasma chamber, and
    a control system communicatively coupled to the insert to move the insert to one or more vertical positions within the plasma chamber.

2. The plasma processing apparatus of claim 1, wherein the insert has a diameter (D1) that is less than a diameter (D2) of the processing chamber.

3. The plasma processing apparatus of claim 2, wherein a vacuum space with a radial thickness is defined between the insert and an inner wall of the plasma chamber, wherein the radial thickness is a difference between diameter (D2) and diameter (D1).

4. The plasma processing apparatus of claim 3, wherein the radial thickness is from about 5 mm to about 150 mm.

5. The plasma processing apparatus of claim 1, wherein the insert can be moved to a vertical position to adjust process uniformity during workpiece processing.

6. The plasma processing apparatus of claim 1, wherein the insert can be moved to a vertical position to adjust efficiency during workpiece processing.

7. The plasma processing apparatus of claim 1, wherein the insert can be moved to a vertical position to increase ash rate during workpiece processing.

8. The plasma processing apparatus of claim 1, wherein the insert comprises quartz or ceramic material.

9. The plasma processing apparatus of claim 1, wherein the control system is further configured to adjust the vertical position of the insert according to a control parameter input to the control system.

10. The plasma processing apparatus of claim 1, wherein a first closed end of the insert can have a vertical position as low as about 1 mm from a top surface of a separation grid, the separation grid separating the processing chamber from the plasma chamber.

11. The plasma processing apparatus of claim 10, wherein a first closed end of the insert can have a vertical position as high as about 100 mm above a top end of the inductively coupled plasma source.

12. The plasma processing apparatus of claim 1, wherein the insert is disposed within in the plasma chamber such that the plasma chamber remains under vacuum.

13. The plasma processing apparatus of claim 1, wherein one or more bellows are used to move the insert to one or more vertical positions in the plasma chamber.

14. The plasma processing apparatus of claim 1, wherein a second open end of the insert is coupled to one or more holding devices disposed on one or more bellows for moving the insert.

15. The plasma processing apparatus of claim 14, wherein one or more shims are disposed between a second open end of the insert and one or more holding devices.

16. The plasma processing apparatus of claim 1, further comprising a gas injection insert disposed in the center of the insert for delivering forced air towards a first closed end of the insert for cooling the insert.

17. A method for processing a workpiece in a plasma processing apparatus, the plasma processing apparatus having a plasma chamber and a processing chamber, the processing chamber having a workpiece support, the processing chamber having an insert disposed therein movable to one or more vertical positions within the plasma chamber, the method comprising:
   admitting a process gas to the plasma chamber;
   generating one or more species from the process gas using a plasma induced in a plasma chamber;
   moving the insert from a first vertical position to a second vertical position within the plasma chamber with a control system communicatively coupled to the insert to move the insert to one or more vertical positions within the plasma chamber;
   filtering the one or more species to generate a filtered mixture; and
   exposing the workpiece to the filtered mixture to process the workpiece.

18. The method of claim 17, wherein the insert is a tubular insert having a first closed end and a second open end, wherein the first closed end is disposed within the plasma chamber and the second open end is open to atmosphere.

* * * * *